United States Patent

Micheloni et al.

[11] Patent Number: 6,157,579
[45] Date of Patent: Dec. 5, 2000

[54] CIRCUIT FOR PROVIDING A READING PHASE AFTER POWER-ON-RESET

[75] Inventors: Rino Micheloni, Turate; Marco MacCarrone, Palestro, both of Italy

[73] Assignee: STMicroelectronics S.r.l., Agrate Brianza, Italy

[21] Appl. No.: 09/295,263

[22] Filed: Apr. 20, 1999

Related U.S. Application Data

[60] Provisional application No. 60/094,798, Jul. 31, 1998.

[51] Int. Cl.[7] .................................................. G11C 16/04
[52] U.S. Cl. ................................ 365/189.07; 365/189.09; 365/226; 365/230.08
[58] Field of Search ........................ 365/189.07, 189.09, 365/226, 189.05, 230.08

[56] References Cited

U.S. PATENT DOCUMENTS

| | | | |
|---|---|---|---|
| 4,531,214 | 7/1985 | Torres et al. | 371/66 |
| 5,301,161 | 4/1994 | Landgraf et al. | 365/219 |
| 5,812,017 | 9/1998 | Golla et al. | 327/536 |

*Primary Examiner*—Richard Elms
*Assistant Examiner*—Hien Nguyen
*Attorney, Agent, or Firm*—Theodore E. Galantha; Stephen Bongini Fleit, Kain, Gibbons, Gutman & Bongini P.I

[57] ABSTRACT

A circuit for providing a first reading phase after a Power-On-Reset in a memory device. The circuit includes a comparator, a reference generator that generates a reference voltage signal that is supplied to one input of the comparator, and a voltage divider that generates an output signal that is supplied to another input of the comparator. The reference voltage signal reaches its steady operational value before the supply voltage, and the output signal has the same linear pattern as the supply voltage with a different angular coefficient. The comparator outputs a control signal for starting the first reading phase of the memory device. In one preferred embodiment, the memory device has a single power supply and a zero consumption standby mode. Additionally, there is provided a method for providing a first reading phase after a Power-On-Reset in a memory device. According to the method, a reference voltage signal and a proportional voltage signal are generated and compared so as to generate a control signal for starting the first reading phase of the memory device. The generated reference voltage signal reaches its steady operational value before the supply voltage, and the generated proportional voltage signal has the same linear pattern as the supply voltage with a different angular coefficient.

20 Claims, 6 Drawing Sheets

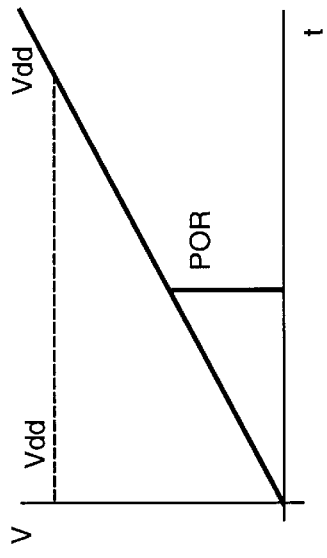
FIG. 1A
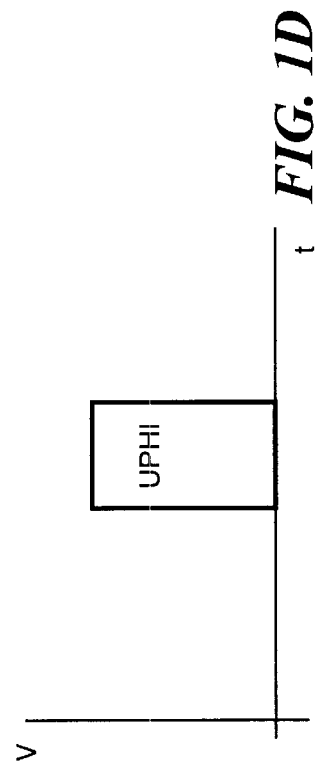
FIG. 1B
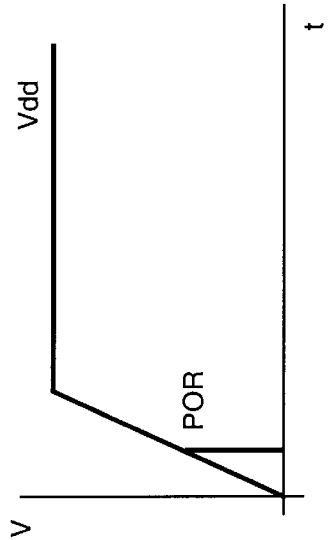
FIG. 1C
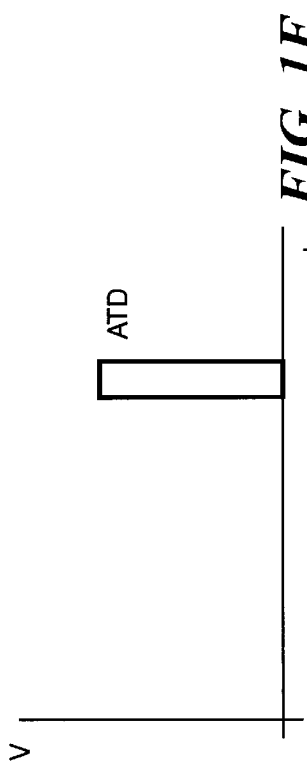
FIG. 1D
FIG. 1E
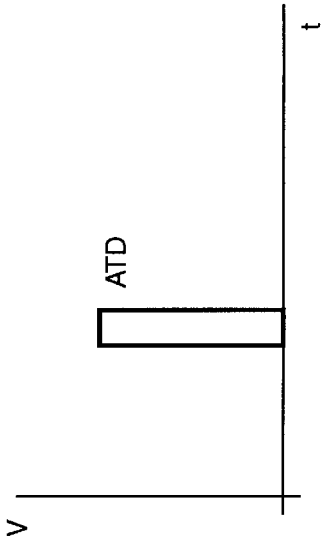
FIG. 1F

CIRCUIT FOR PROVIDING A READING PHASE AFTER POWER-ON-RESET

CROSS-REFERENCE TO RELATED APPLICATIONS

This application is based upon and claims priority from prior U.S. Provisional Application Ser. No. 60/094,798, filed Jul. 31, 1998, the entire disclosure of which is herein incorporated by reference.

BACKGROUND OF THE INVENTION

1. Field of the Invention

The present invention relates to semiconductor memory devices, and more specifically to memory devices that have a low or zero consumption "standby" mode.

2. Description of Related Art

In a conventional memory device that uses a floating gate NMOS transistor with source and drain terminals as the elementary cell, the modulation of the threshold voltage of the cell is used to distinguish two logic states. A first logic state (e.g., logic "1"), is characteristic of a virgin cell and corresponds to the case in which the floating gate does not contain a charge, and another logic state (e.g., logic "0") corresponds to the case in which the floating gate stores sufficient electrons to determine a macroscopic increase in the threshold voltage and identify a programmed state of the memory cell.

In the reading phase, the memory cell is usually polarized with a gate source voltage equal to the supply voltage of the device (i.e., the source terminal is grounded and the drain terminal is at about 1 V). If the cell is written, the threshold voltage is above Vcc and therefore current does not flow. On the other hand, if the cell is erased, the threshold voltage must be such that current flows. The distribution of the cells after electrical erasure is typically between about 0.5 V and 2.5 V. The lower of the values is determined by the necessity to guarantee the absence of depleted cells and to avoid damage to the thin oxide of the floating gate transistor in the writing phase, and the higher of the values is determined by the intrinsic width of the distribution.

With low supply voltages (e.g., with Vcc values of around 2.5 V), the erased cells with thresholds near the upper boundary of the distribution do not drain sufficient current and therefore cannot be read correctly as storing logic "1". This problem can be overcome by providing a boost voltage to the row of cells. More specifically, a higher voltage is supplied to the Vcc supply and to the gate of the cell to be read, while the distribution of the thresholds remains the same. There are various conventional devices that use methods of voltage boosting.

1) Continuous Boost

When a read is to be carried out in a device using continuous boost, suitable clock impulses are supplied to the boost circuit to force the charge of a boost capacity and take the row to a voltage higher than Vcc. This method has an advantage in that the boost capacity need not be very large because the boosted voltage is produced by a series of small increases. However, for this same reason the amount of time necessary to initially charge the boost capacity is very high. Therefore, there is an increase in both the memory access time after the switch-off phase (i.e., power down) and the memory access time after a standby phase. In both of these phases, all the circuits of the memory device are switched off in order to limit consumption. To obviate the delay after a standby phase, it is possible to utilize a second smaller boost that keeps the main capacitor charged during standby. However, this increases the demand for current in this phase.

2) Impulse Boost

Devices using impulse boost solution a very large boost capacity is provided because this is necessary to increase the supply voltage of the whole supply of the row decoder. Furthermore, this capacity must be charged in a single strike and at the correct moment (i.e., when reading of a well-defined memory location is requested). On the other hand, the impulse boost method resolves increased access time out of standby and current consumption problems.

In semiconductor memories such as those of the EPROM and FLASH type, in order to be able to use devices having a few defective bits, redundancy circuitry is provided. This allows for a re-addressing of the memory in order to substitute working addresses in an added matrix portion for the addresses containing the defective bits. In order to contain the information for the substituted addresses in the memory matrix, memory cells (e.g., EPROM or FLASH) that are programmed during EWS (Electrical Wafer Sort) are used. Such cells are known as UPROM cells and during operation are read before carrying out any programming of the memory to allow for correct identification of the substituted addresses.

Nearly all digital electronic devices have a problem correctly resetting at the moment the power is switched on. There are conventional circuits, which are known as Power-On-Reset (POR) circuits, that are dedicated to the generation of a reset signal POR at the moment an electronic device switches on. During operation, at the moment that the voltage supply ramp Vdd terminates, the device must be ready to operate without any further commands (based on industry specifications for nonvolatile memory devices). This means that the memory must be ready to be interrogated for the contents of a selected memory location.

Thus, it is necessary to have already read the UPROM contents (i.e., a part of the Vdd ramp must be utilized to read the UPROM bank). For this reason, the trigger value of the reset signal POR that starts the reading of the UPROMs must chosen to be lower than Vdd. Furthermore, in positioning the trigger threshold of the reset signal POR, the noise margin must be considered with respect to variations in the supply voltage. For example, if the trigger threshold is set too high, the high threshold could cause the device to reset itself during typical Vdd noise.

With these considerations in mind, let us consider a non-volatile memory that requires a voltage boost and has zero consumption in the standby phase. With these requirements, the boost method that is used must be of the impulse one stroke type.

With this type of boost, the boost capacitor must be recharged after each reading.

Furthermore, for an asynchronous-type memory, the boost phases must be accurately timed and require a start signal ATD. If the memory device is designed to be read between 2.7 V and 3.8 V, the device is designed to work over the range covered by conventional specifications (e.g., the memory could be read from 2.3 V to 4 V). With such conditions, the value of the reset signal POR is typically set at around 1.8 V.

In accordance with the current requirements for the device, the user can supply the desired addresses when the device is not receiving current, with the supply only later switching on. Therefore, the reset signal POR must start the reading once the Vdd voltage has reached a sufficient value. If reading is started with a Vdd voltage that is too low, the reading operation would not be successful. Further, the user does not modify the addresses so there would not be another reading of the data. In other words, once the working value of the supply is reached, there is no signal to restart the reading operation so the user reads incorrect data.

SUMMARY OF THE INVENTION

In view of these drawbacks, it is an object of the present invention to overcome the above-mentioned drawbacks and to provide a circuit that signals the correct value of Vdd for reading during the ramping of the supply in a memory device having a standby mode. The circuit generates a first read signal based on a comparison between a ramp proportional to the supply voltage and the potential of an internal reference node. The voltage on the reference node reaches its working value before the supply voltage.

One embodiment of the present invention provides a circuit for providing a first reading phase after a Power-On-Reset in a memory device. The circuit includes a comparator, a reference generator that generates a reference voltage signal that is supplied to one input of the comparator, and a voltage divider that generates an output signal that is supplied to another input of the comparator. The reference voltage signal reaches its steady operational value before the supply voltage, and the output signal has the same linear pattern as the supply voltage with a different angular coefficient. The comparator outputs a control signal for starting the first reading phase of the memory device. In one preferred embodiment, the memory device has a single power supply and a zero consumption standby mode.

Another embodiment of the present invention provides a method for providing a first reading phase after a Power-On-Reset in a memory device. According to the method, a reference voltage signal and a proportional voltage signal are generated and compared so as to generate a control signal for starting the first reading phase of the memory device. The generated reference voltage signal reaches its steady operational value before the supply voltage, and the generated proportional voltage signal has the same linear pattern as the supply voltage with a different angular coefficient.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIGS. 1A and 1B show voltage-time diagrams of power-up signals for different climbing speeds of the supply ramp;

FIGS. 1C and 1D show voltage-time diagrams of a UPROM cell read signal with a duration independent of the climbing speed of the supply ramp;

FIGS. 1E and 1F show voltage-time diagrams of a timing signal with a duration independent of the climbing speed of the supply ramp;

DETAILED DESCRIPTION OF PREFERRED EMBODIMENTS

Preferred embodiments of the present invention will be described in detail hereinbelow with reference to the attached drawings.

The waveforms of FIGS. 1A through 1F show Power-On-Reset (POR) signals, UPHI signal, and ATD signals for different climbing speeds of the supply ramp. The UPHI signal represents the read phase of the UPROM and has a speed that is independent from the speed of the ramp. For a fast ramp (FIGS. 1A, 1C, and 1E), when the UPHI phase finishes, the value of the voltage Vdd is already sufficient to read. Thus, it is possible to use the falling edge of UPHI signal to start the first read. On the other hand, for a slow ramp (FIGS. 1B, 1D, and 1F), at the end of the UPHI phase, the voltage Vdd is not high enough to allow a correct reading operation. Thus, the single UPHI signal is not sufficient to guarantee correct functioning of the memory device under all possible conditions.

Figure 2:
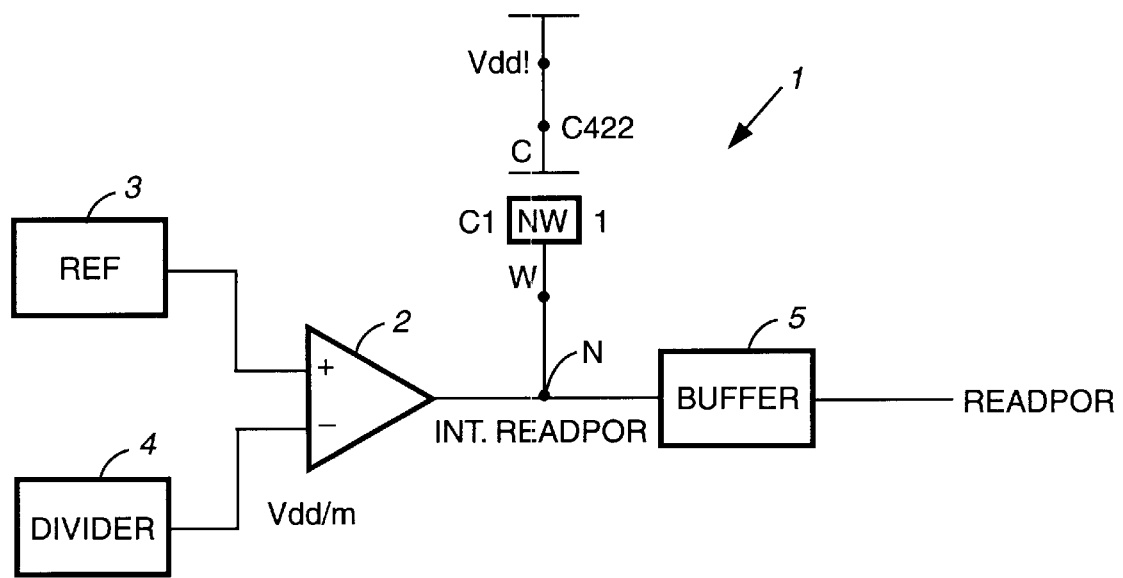
FIG. 2 shows a block diagram of a circuit in accordance with a preferred embodiment of the present invention.

FIG. 2 shows a circuit according to a preferred embodiment of the present invention for carrying out a reading phase after a Power-On-Reset. The circuit 1 includes a comparator 2 having a first non-inverting input (+) and a second inverting input (−). The output of a block 3 that generates a stable reference voltage Vref is connected to the first input of comparator 2. The second input of the comparator 2 is connected to another block 4 that produces an output voltage with the same linear pattern as the supply voltage Vdd but with an angular coefficient taken down by a factor "in". In other words, the output of block 4 is proportional to the supply voltage by a factor of 1/m, with the parameter m being a partition ratio for guaranteeing the necessary stability, as will be explained below.

A capacitor C1 is connected between the supply voltage Vdd and a node N receiving the output of the comparator 2 to form an INT_READPOR signal. The capacitor C1 aids the coupling of the INT_READPOR signal with the supply voltage Vdd during the upward transition, while allowing the comparator 2 to set its working value. Downstream of the comparator 2, there is a buffer stage 5 that receives the output of the comparator 2 and outputs a first reading signal READPOR in accordance with the principles of the present invention. The introduction of the buffer frees the dynamics of the output signal (the swing of which is equal to the whole supply voltage Vdd) from that of the INT_READPOR signal on node N, so that the latter can have lower variations. This improves the reaction speed of the circuit.

Figure 3:
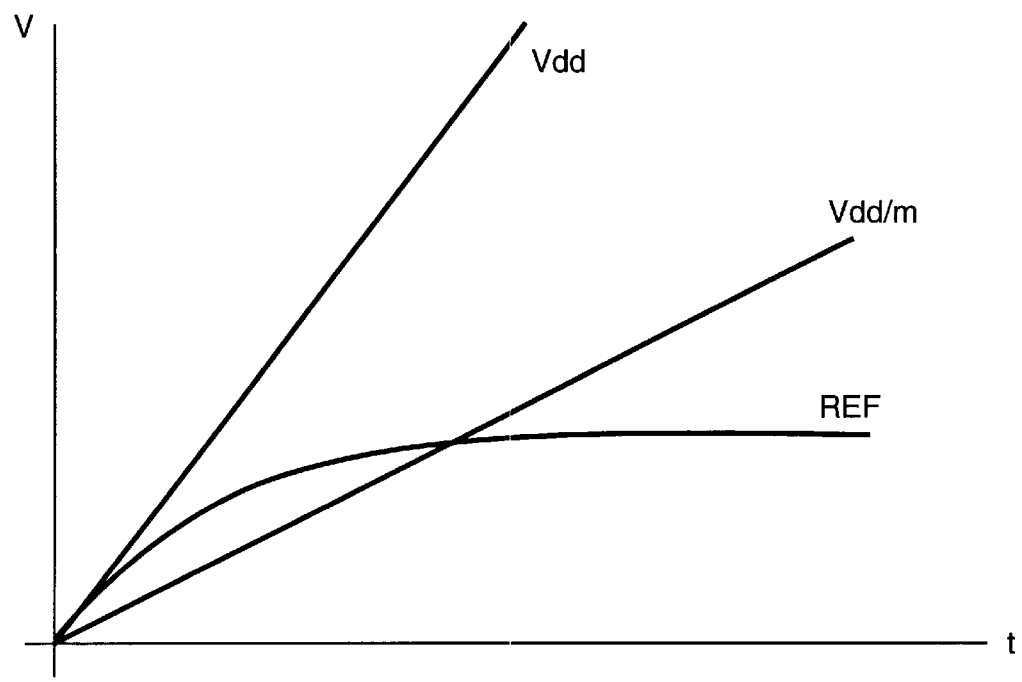
FIG. 3 shows a voltage-time diagram that compares voltage signals in the circuit of FIG. 2.

The circuit 1, which generates the signal for the first reading READPOR, essentially operates by comparing the supply voltage ramp Vdd with the potential Vref, which is internally produced by the circuit to act as a reference. For the circuit 1 to operate correctly, the voltage on the first input of the comparator 2 needs to reach its working value before the supply voltage Vdd. The comparator 2 compares the two signals Vref and Vdd/m and produces a signal that directly influences the start of the first reading phase. The voltage waveforms of the various signals Vref, Vdd, and Vdd/m are shown in FIG. 3.

Figure 4:
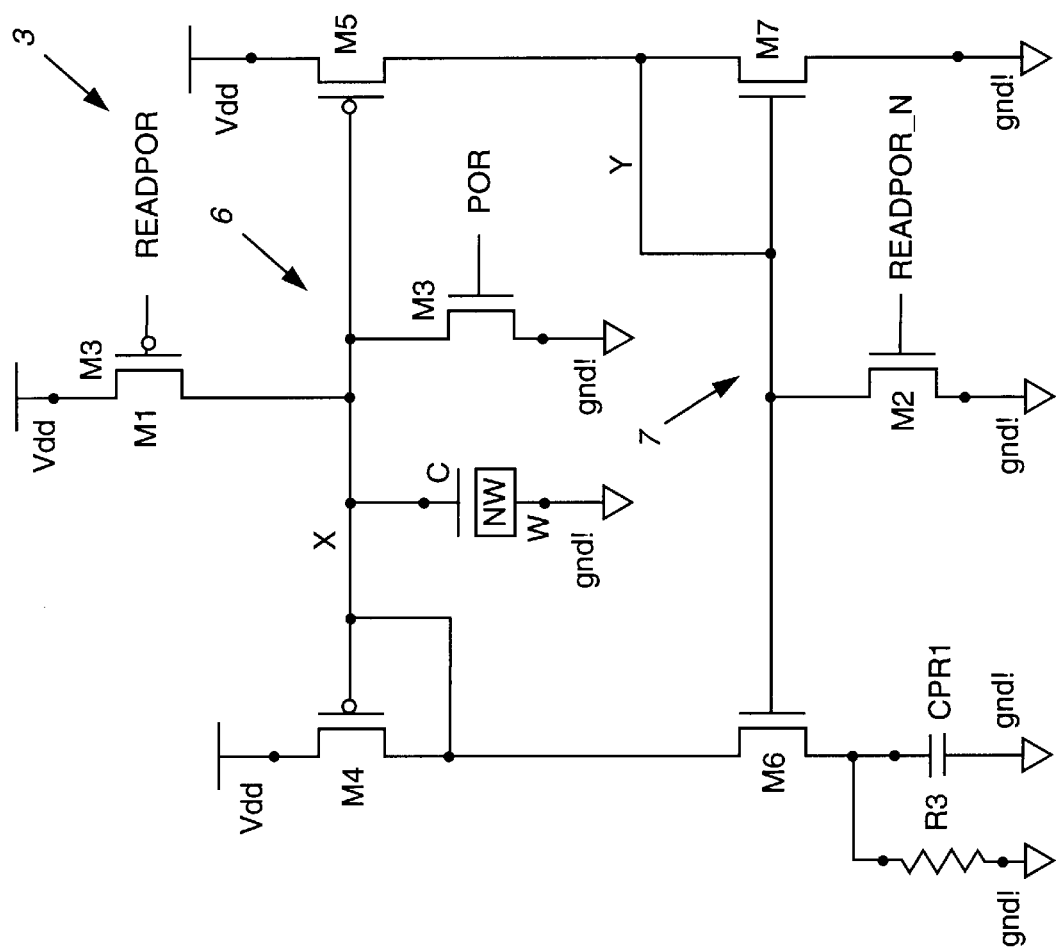
FIG. 4 shows a schematic view of an embodiment of a portion of the circuit of FIG. 2.

FIG. 4 shows the structure of the block 3 that generates the reference signal Vref in greater detail. This block 3 includes two current mirrors 6 and 7 that are respectively controlled by two transistors M1 and M2 that allow the corresponding mirrors to be switched off when the signal READPOR reaches its low value. In particular, the first mirror 6 includes two PMOS transistors M4 and M5 whose gate terminals are connected to one another at a node X and to the supply Vdd through the PMOS transistor M1, which is controlled by the signal READPOR output by the circuit 1. The second mirror 7 includes two NMOS transistors M6 and M7 whose gate terminals are connected to one another at a node Y and to ground through the NMOS transistor M2, which is controlled by the signal READPOR_N (i.e., the complement of the output of the circuit 1).

Figure 9:
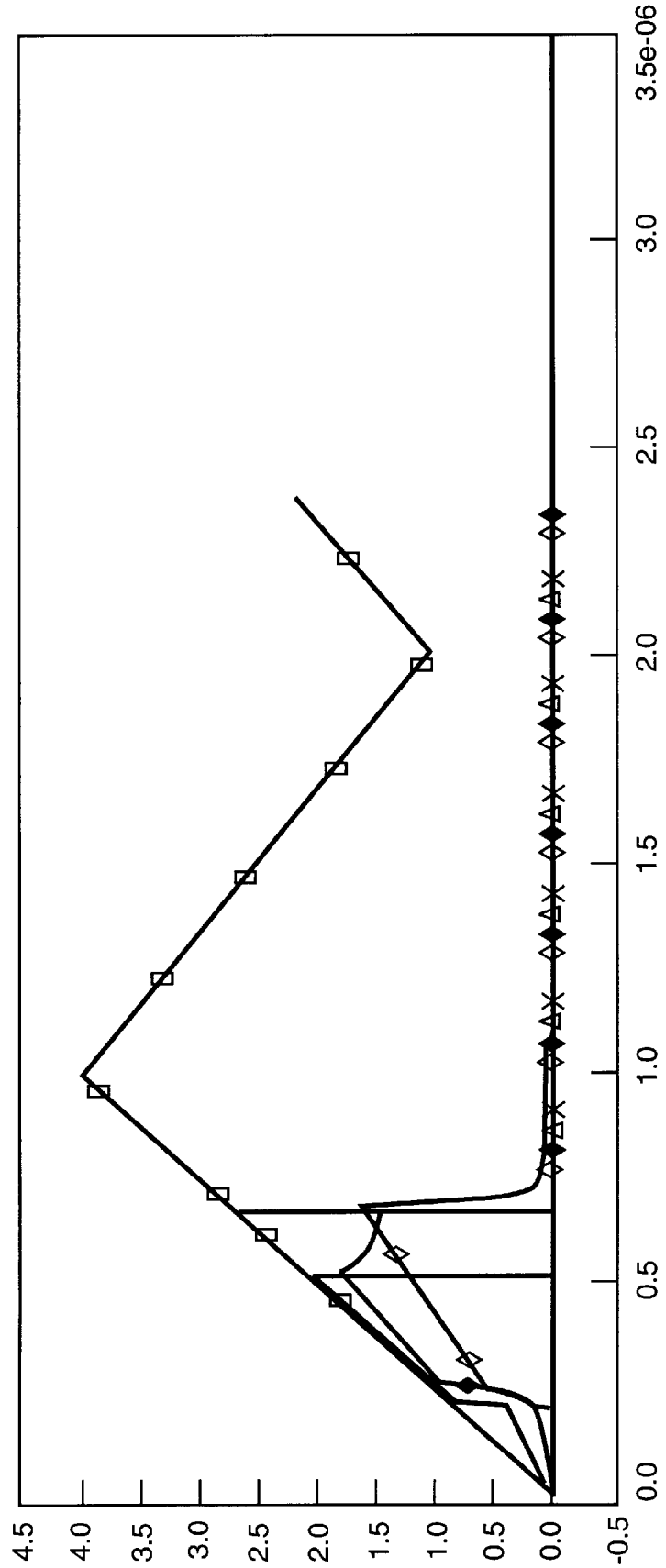
FIG. 9 shows a comparative voltage-time diagram of the patterns of voltage signals in one embodiment of the circuit of the present invention.

A resistor R3 is connected between the transistor M6 and ground to compensate for effects caused by temperature variations. A transistor M3 is connected between node X and ground GND and is controlled by the Power-On-Reset signal POR. The transistor M3 serves to carry out the startup of the double mirror 6, 7. In particular, without such a transistor M3, the current mirrors 6 and 7 could remain off because this is another balance position in the circuit. The signal POR used to control the transistor M3 is the reset signal for the entire device. When the signal POR ends, node Y quickly takes itself towards its balance value (as shown in FIG. 9). The voltage level at node Y works out to be sufficiently stable with respect to possible temperature variations and process parameter variations.

Figure 5:
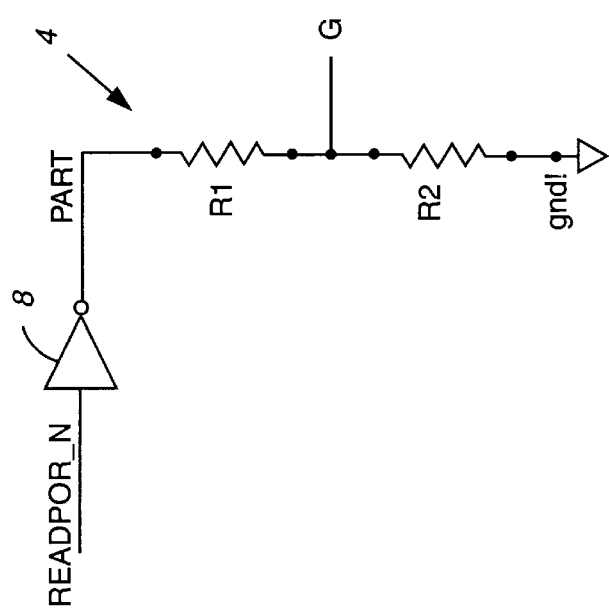
FIG. 5 shows a schematic view of an embodiment of another portion of the circuit of FIG. 2.

FIG. 5 shows an exemplary embodiment of the divider block 4. The divider of block 4 is essentially a resistive divider formed with two resistors R1 and R2, with the voltage Vdd/m being taken from an output node G of the divider. The divider of block 4 is controlled by an inverter 8 that receives the complemented signal READPOR_N. In steady operation, the READPOR signal is high so both resistors R1 and R2 are short circuited to ground in order to eliminate current consumption in the circuit.

Figures 6, 7:
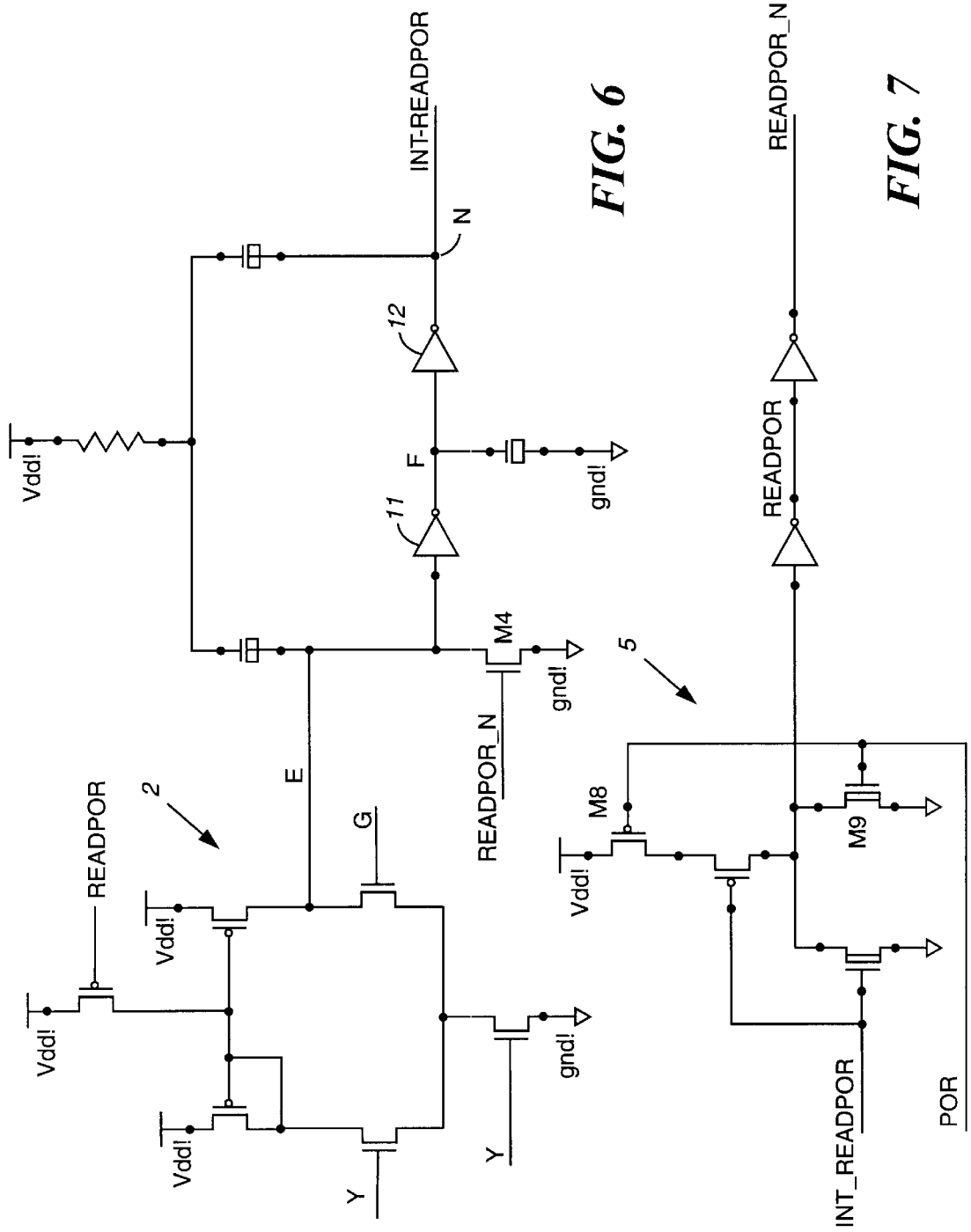
FIG. 6 shows a schematic view of an embodiment of another portion of the circuit of FIG. 2.
FIG. 7 shows a schematic view of an embodiment of another portion of the circuit of FIG. 2.

FIG. 6 shows an exemplary embodiment of the comparator 2 that compares the divided supply Vdd/m and the reference voltage Vref at node Y of block 3. The comparator 2 includes a differential stage having an output E that is suitably amplified by two inverters 11 and 12. An NMOS transistor M4, which is connected between the output E and ground GND, takes the inverters to a state of zero consumption once the steady operation condition in which READPOR is low is reached. The control terminal of the NMOS transistor M4 receives the complemented signal READPOR_N. FIG. 7 shows an embodiment of the buffer stage 5 that includes two enable transistors M8 and M9, which receive at their gate terminals a signal POR from the device in which the circuit 1 is incorporated.

Figure 8A:
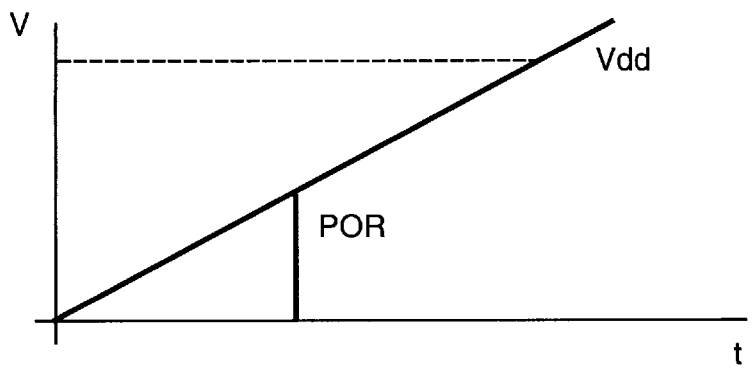
FIGS. 8A through 8D show voltage-time diagrams for voltage signals when using the preferred embodiment of the circuit of the present invention.
Figure 8B:
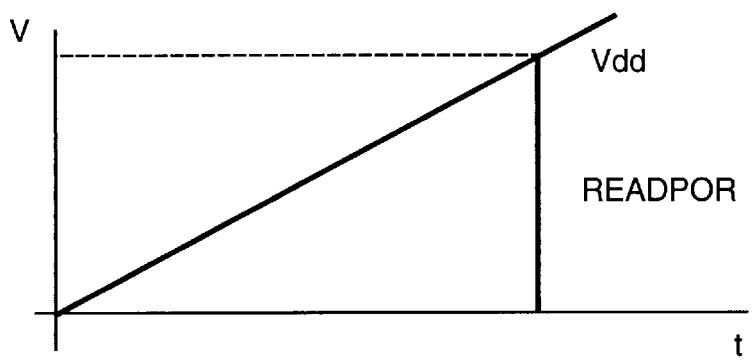
Figure 8C:
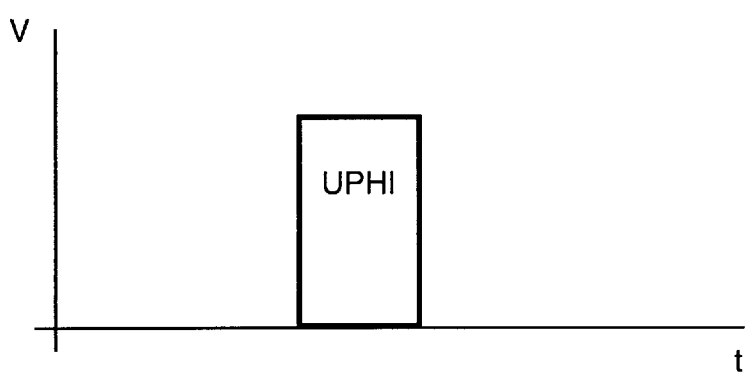
Figure 8D:
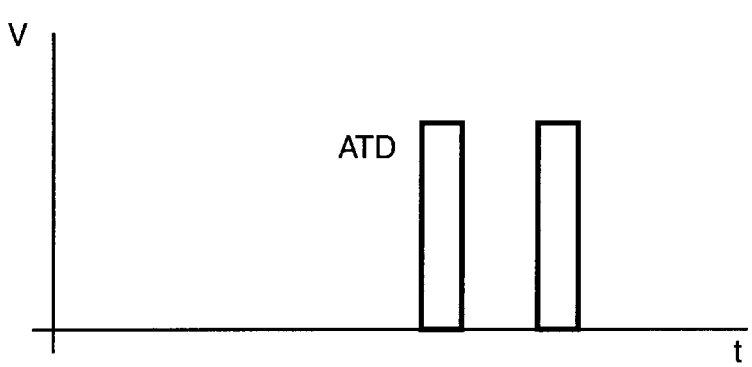

Advantageously, the trigger threshold of the circuit 1 for the first reading can be positioned at 2.4 V (i.e., the minimum allowed supply value Vdd for correct reading with a certain margin of accuracy). It is important to note that the noise margin is still associated with the circuit that generates the reset signal POR. In other words, as long as the reset signal POR is not regenerated, the circuit 1 for first reading does not switch back on. By using the circuit 1 to generate the signal READPOR, the signal waveforms illustrated in FIGS. 1B, 1D, and 1F for slow ramps modify to those shown in FIGS. 8A, 8C, and 8D.

The generation of the timing impulse ATD both at the end of the reading phase of the UPROM (as indicated by the signal UPHI) and at the end of the first reading phase (as indicated by the signal READPOR) solves the problems of conventional memory devices with respect to providing the first reading phase after a Power-On-Reset. More specifically, the signal READPOR is triggered when the supply voltage Vdd is sufficient for reading. FIG. 9 shows the comparative voltage-time diagram for a simulation that was carried out by the applicants. The diagram shows the voltage levels for the main nodes of the circuitry described above (i.e., nodes Y, G, INT_READPOR, and UPOR).

Accordingly, the circuit of the present invention allows the correct value of the supply voltage Vdd for reading to be detected during the climbing of the supply ramp. The circuit of the present invention is particularly suited for use with memory devices having low supply voltages and devices requiring zero consumption and a power supply of the word line. Further, the circuit of the preferred embodiment of the present invention allows the trigger value of the Power-On-Reset circuitry to be set independently of the minimum value of the supply voltage needed to carry out a correct reading of address data.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, other embodiments of the present invention may not include all of the features described above. Therefore, it is intended that the present invention not be limited to the particular embodiments disclosed, but that the invention include all embodiments falling within the scope of the appended claims.

What is claimed is:

1. A circuit for providing a first reading phase after a Power-On-Reset in a memory device, said circuit comprising:

a comparator having first and second inputs;

a reference generator receiving a supply voltage and generating a reference voltage signal that is supplied to the first input of the comparator; and a voltage divider generating an output signal that is supplied to the second input of the comparator, the output signal being a voltage with the same linear pattern as the supply voltage, but with a different angular coefficient, wherein the reference voltage signal reaches its steady operational value before the supply voltage, and the comparator outputs a control signal when the supply voltage is sufficient for reading in order to start the first reading phase of the memory device after the Power-On-Reset.

2. The circuit as defined in claim 1, wherein the output signal of the voltage divider has a voltage that is proportional to the supply voltage according to a factor of 1/m.

3. The circuit as defined in claim 1, further comprising a capacitor coupled between the supply voltage and the output of the comparator.

4. The circuit as defined in claim 1, further comprising at least one buffer stage connected to the output of the comparator.

5. The circuit as defined in claim 1, wherein the memory device has a single power supply and a standby mode.

6. The circuit as defined in claim 5, wherein the memory device has zero consumption in the standby mode.

7. The circuit as defined in claim 1, wherein the circuit has a trigger threshold of approximately 2.4 volts.

8. The circuit as defined in claim 1, wherein the circuit has a trigger threshold that is independent of a threshold for generating a Power-On-Reset signal in the memory device.

9. An information handling system including at least one memory device that contains a circuit for providing a first reading phase after a Power-On-Reset in the memory device, said circuit comprising:

a comparator having first and second inputs;

a reference generator receiving a supply voltage and generating a reference voltage signal that is supplied to the first input of the comparator; and a voltage divider generating an output signal that is supplied to the second input of the comparator, the output signal being a voltage with the same linear pattern as the supply voltage, but with a different angular coefficient, wherein the reference voltage signal reaches its steady operational value before the supply voltage, and the comparator outputs a control signal when the supply voltage is sufficient for reading in order to start the first reading phase of the memory device after the Power-On-Reset.

10. The information handling system as defined in claim 9, wherein the output signal of the voltage divider has a voltage that is proportional to the supply voltage according to a factor of 1/m.

11. The information handling system as defined in claim 9, wherein the circuit further comprises a capacitor coupled between the supply voltage and the output of the comparator.

12. The information handling system as defined in claim 9, wherein the circuit further comprises at least one buffer stage connected to the output of the comparator.

13. The information handling system as defined in claim 9, wherein the memory device has a single power supply and a standby mode.

14. The information handling system as defined in claim 9, wherein the circuit has a trigger threshold that is independent of a threshold for generating a Power-On-Reset signal in the memory device.

15. A method for providing a first reading phase after a Power-On-Reset in a memory device, said method comprising the steps of:

generating a reference voltage signal that reaches its steady operational value before a supply voltage for the memory device;

generating a proportional voltage signal, the proportional voltage signal having the same linear pattern as the supply voltage, but with a different angular coefficient; and comparing the reference voltage signal and the proportional voltage signal so as to generate a control signal when the supply voltage is sufficient for reading in order to start the first reading phase of the memory device after the Power-On-Reset.

16. The method as defined in claim 15, wherein the proportional voltage signal is proportional to the supply voltage according to a factor of 1/m.

17. The method as defined in claim 15, wherein the memory device has a single power supply and a zero consumption standby mode.

18. The method as defined in claim 15, further comprising the step of buffering the control signal.

19. The method as defined in claim 15, wherein in the comparing step, the control signal is generated approximately when the supply voltage reaches 2.4 volts.

20. The method as defined in claim 15, wherein in the comparing step, the control signal is generated when or a predetermined time after the proportional voltage signal becomes greater than the reference voltage signal.

* * * * *

UNITED STATES PATENT AND TRADEMARK OFFICE
CERTIFICATE OF CORRECTION

PATENT NO.    : 6,157,579
DATED         : December 5, 2000
INVENTOR(S)   : Rino Micheloni et al.

It is certified that error appears in the above-identified patent and that said Letters Patent is hereby corrected as shown below:

Under Attorney, Agent, or Firm, please change "Theodore E. Galantha" to -- Theodore E. Galanthay --

Please change "Bongini Fleit" to -- Bongini; Fleit --

Please change "P .I" to -- P.L. --

Signed and Sealed this

Twenty-fifth Day of September, 2001

*Attest:*

NICHOLAS P. GODICI
*Attesting Officer*    Acting Director of the United States Patent and Trademark Office